(12) United States Patent
Jeon

(10) Patent No.: US 8,906,781 B2
(45) Date of Patent: Dec. 9, 2014

(54) METHOD FOR ELECTRICALLY CONNECTING WAFERS USING BUTTING CONTACT STRUCTURE AND SEMICONDUCTOR DEVICE FABRICATED THROUGH THE SAME

(71) Applicant: Siliconfile Technologies Inc., Seongnam-si, Gyeonggi-do (KR)

(72) Inventor: In Gyun Jeon, Seongnam-si (KR)

(73) Assignee: Siliconfile Technologies Inc., Seongnam-Si, Gyeonggi-Do (KR)

( * ) Notice: Subject to any disclaimer, the term of this patent is extended or adjusted under 35 U.S.C. 154(b) by 0 days.

(21) Appl. No.: 14/079,075

(22) Filed: Nov. 13, 2013

(65) Prior Publication Data

US 2014/0138847 A1    May 22, 2014

(30) Foreign Application Priority Data

Nov. 16, 2012    (KR) .................. 10-2012-0129899

(51) Int. Cl.
| | |
|---|---|
| *H01L 21/46* | (2006.01) |
| *H01L 25/00* | (2006.01) |
| *H01L 23/48* | (2006.01) |
| *H01L 23/00* | (2006.01) |
| *H01L 21/768* | (2006.01) |
| *H01L 27/146* | (2006.01) |

(52) U.S. Cl.
CPC .............. *H01L 25/50* (2013.01); *H01L 23/481* (2013.01); *H01L 24/80* (2013.01); *H01L 24/92* (2013.01); *H01L 21/76802* (2013.01); *H01L 27/14634* (2013.01); *H01L 27/1469* (2013.01); *H01L 2224/06517* (2013.01); *H01L 2224/821* (2013.01); *H01L 2224/08147* (2013.01); *H01L 24/06* (2013.01); *H01L 24/08* (2013.01); *H01L 24/82* (2013.01); *H01L 2224/05571* (2013.01); *H01L 2224/05573* (2013.01); *H01L 2224/05647* (2013.01); *H01L 2224/05686* (2013.01); *H01L 2224/06051* (2013.01); *H01L 2224/06505* (2013.01); *H01L 2224/80895* (2013.01); *H01L 2224/80896* (2013.01); *H01L 2224/9202* (2013.01); *H01L 2224/9212* (2013.01); *H01L 24/07* (2013.01); *H01L 2224/82031* (2013.01)
USPC .......................................... 438/459; 438/455

(58) Field of Classification Search
USPC ................................. 438/455, 459
See application file for complete search history.

(56) References Cited

U.S. PATENT DOCUMENTS 8,563,403 B1 * 10/2013 Farooq et al. ................. 438/459
2014/0042299 A1 * 2/2014 Wan et al. .................. 250/208.1

\* cited by examiner

*Primary Examiner* — Bradley K Smith
(74) *Attorney, Agent, or Firm* — Kile Park Reed & Houtteman PLLC

(57) ABSTRACT

The present invention relates to a method for electrically connecting wafers, which physically bonds two wafers through an oxide-to-oxide bonding method and then electrically connects the two wafers through a butting contact structure. The wafers are physically bonded to each other through a relatively simple method, and then electrically connected to through TSVs or butting contact holes. Therefore, since the fabrication process may be simplified, a process error may be reduced, and the product yield may be improved.

9 Claims, 3 Drawing Sheets

METHOD FOR ELECTRICALLY CONNECTING WAFERS USING BUTTING CONTACT STRUCTURE AND SEMICONDUCTOR DEVICE FABRICATED THROUGH THE SAME

BACKGROUND OF THE INVENTION

1. Field of the Invention

The present invention relates to a method for electrically connecting two wafers, and more particularly, to a method for electrically connecting wafers using a butting contact structure, which physically bonds two wafers according to an oxide-to-oxide bonding method and then electrically connects the two wafers using a butting contact structure.

2. Description of the Related Art

Recently, the process for reducing the physical size of an integrated circuit by reducing the sizes of devices on a wafer has reached the limit. In order to overcome such a limit, a method of vertically stacking two or more wafers has been proposed.

FIG. 1 is a cross-sectional view of a conventional semiconductor device fabricated through a metal-to-metal bonding method.

For convenience of description, suppose that the semiconductor device of FIG. 1 is a part of an image sensor. The semiconductor device includes an upper wafer 110 and a lower wafer 120. The upper wafer 110 includes a photodiode PD to generate charges corresponding to the amount of light incident from the top and a floating diffusion FD to temporarily store the charges. The lower wafer 120 includes elements constituting the image sensor excluding the photodiode PD.

Referring to FIG. 1, two wafers each having different elements implemented therein are bonded to each other. In FIG. 1, A, B, D, and D represents regions in which a metal as a conductive material or polycrystalline silicon is formed. The regions A and C formed in the upper wafer 110 must be electrically connected to the regions B and D formed in the lower wafer 120, respectively.

When a semiconductor fabrication process is completed, the top surface of a wafer is covered by an insulating material. Thus, when the top surfaces of two wafers are physically bonded to each other, the two wafers are electrically insulated from each other. For this reason, in order to electrically connect two wafers, conductive materials must be formed on the bonded portions of the two wafers. The conductive materials must be physically bonded to each other.

Referring to FIG. 1, a conductive material such as copper (Cu) may be formed on the surfaces of the regions A and C formed in the upper wafer 110 and the surfaces of the regions B and D formed in the lower wafer 120.

According to the above-described conventional metal-to-metal bonding method, the two wafers 110 and 120 are electrically connected to each other through the conductive layers formed on the surfaces of the regions A to D of the upper and lower wafers 110 and 120. Thus, the thickness of the wafers is inevitably increased. With the increase in thickness of the wafers, the lengths of wirings for electrical connection between elements formed in the two wafers 110 and 120 are increased. Thus, a power loss caused by resistance of the wirings cannot be ignored.

Furthermore, while each of the wafers is fabricated, the process of forming the conductive layer for electrical conduction must be separately performed during the bonding process. Thus, the time required for performing the process inevitably increases.

SUMMARY OF THE INVENTION

Accordingly, the present invention has been made in an effort to solve the problems occurring in the related art, and an object of the present invention is to provide a method for electrically connecting wafers using a butting contact structure, which uses an oxide-to-oxide bonding method as a physical bonding process and uses a TSV or butting contact method as an electrical bonding process when bonding wafers, thereby simplifying additional processes.

Another object of the present invention is to provide a semiconductor device which is fabricated through a method for electrically connecting wafers using a butting contact structure, which uses an oxide-to-oxide bonding method as a physical bonding process and uses a TSV or butting contact method as an electrical bonding process when bonding wafers, thereby simplifying additional processes In order to achieve the above object, according to one aspect of the present invention, there is provided a method for electrically connecting wafers, which electrically connects first and second wafers subjected to a series of processes using a butting contact structure. The method includes: physically bonding the first and second wafers through an insulator-to-insulator bonding method; and electrically connecting a first conductive region of the first wafer to a second conductive region of the second wafer corresponding to the first conductive region through a metal-to-metal bonding method using through-silicon vias (TSVs) or butting contact holes.

According to another aspect of the present invention, there is provided a semiconductor device including first and second wafers which are electrically connected to each other. The first wafer includes one or more of a plurality of elements constituting a CMOS image sensor, and the second wafer includes a pixel driving circuit and the other elements of the plurality of elements constituting the CMOS image sensor excluding the elements formed in the first wafer.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1:
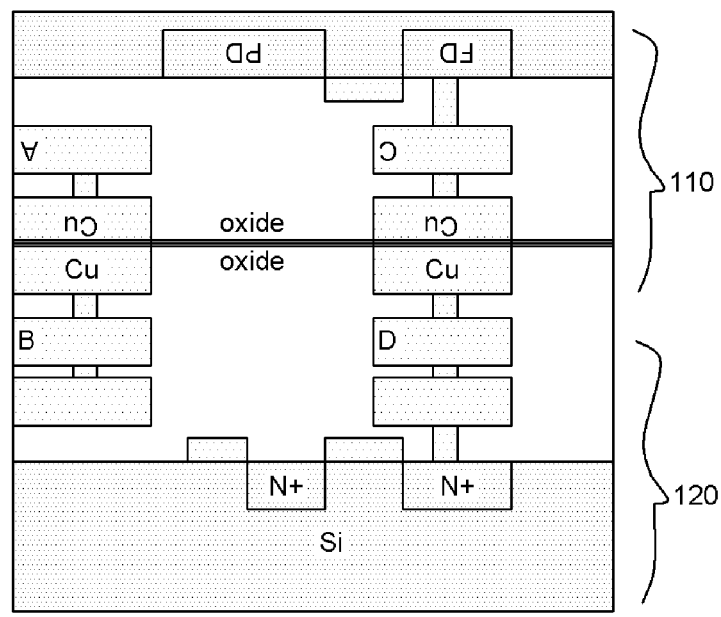
FIG. 1 is a cross-sectional view of a conventional semiconductor device fabricated through a metal-to-metal bonding method.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 2:
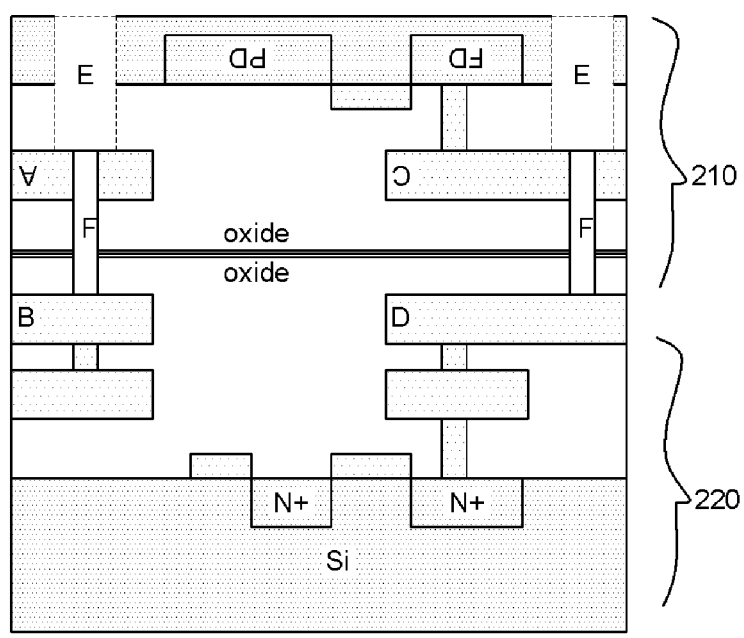
FIG. 2 is a cross-sectional view of a semiconductor device fabricated through a method for electrically connecting wafers according to an embodiment of the present invention.

FIG. 2 is a cross-sectional view of a semiconductor device fabricated through a method for electrically connecting wafers according to an embodiment of the present invention.

Referring to FIG. 2, a physical bonding process for the semiconductor device according to the embodiment of the present invention is implemented through an oxide-to-oxide bonding method. According to the oxide-to-oxide bonding method, upper and lower wafers 210 and 220 covered with oxide are physically bonded to each other. Thus, the two wafers 210 and 220 are electrically insulated from each other. When this method is applied, only the alignment between the two wafers 210 and 220 may be considered. Thus, the bonding process may be relatively easily performed.

FIG. 2 illustrates that the two wafers 210 and 220 are bonded to each other according to the oxide-to-oxide bonding method. However, this is only an example, and the two wafers 210 and 220 may be bonded to each other through another bonding method, instead of the oxide-to-oxide bonding method.

In the conventional semiconductor device of FIG. 1, the bonded portion between the two wafers 110 and 120 is divided into the conductor (Cu) and the oxide. In the embodiment of FIG. 2, however, the entire bonded portion between the two wafers 210 and 220 is oxide. In FIG. 2, F represents a butting contact hole which is formed after physical bonding. The butting contact hole will be described below.

First conductive regions A and C formed in the first wafer 210 are electrically connected to second conducive regions B and D formed in the second wafer 220 through first butting contact holes E formed in the first conductive regions A and C through the substrate of the first wafer 210 and second butting contact holes F formed between the first conductive regions A and C and the second conductive regions B and D, respectively.

The first butting contact hole E is filled with an insulating material, and the second butting contact hole F is filled with a conductive material. Thus, only necessary parts may be electrically connected to each other.

FIG. 2 illustrates the first butting contact hole E has a larger cross-sectional area than the second butting contact hole F. However, the first and second butting contact holes E and F may have the same cross-sectional area. Whether the first and second butting contact holes E and F are formed to have different cross-sectional areas or the same cross-sectional area is not a special technique for those skilled in the art. Thus, the detailed descriptions thereof are omitted herein.

When the first and second butting contact holes E and F are formed, the following process may be commonly performed regardless of whether the first and second butting contact holes E and F have different cross-sectional areas or the same cross-sectional area: a photoresist is applied, a predetermined pattern formed in a mask is reflected onto the photoresist, and the photoresist is baked and then etched.

Hereafter, a process for fabricating the semiconductor device of FIG. 2 will be described.

Figure 3A:
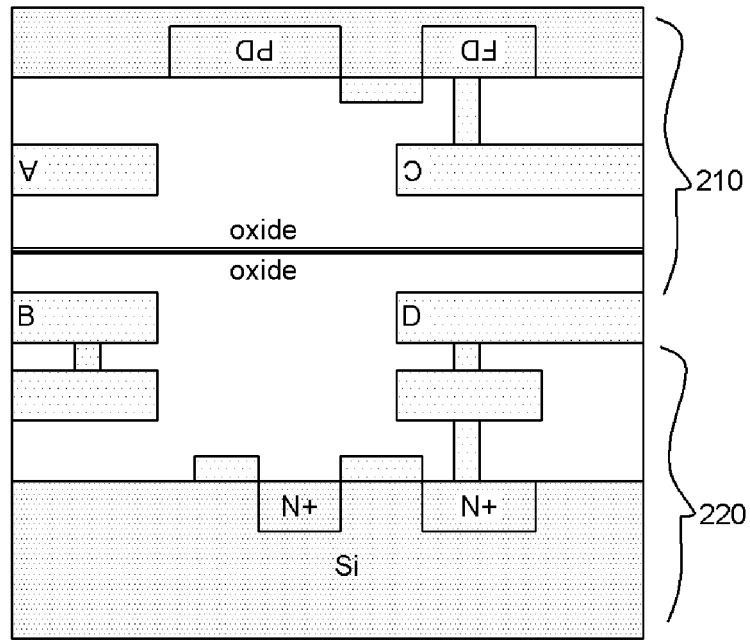
FIG. 3A illustrates that two wafers are physically bonded to each other.
Figure 3B:
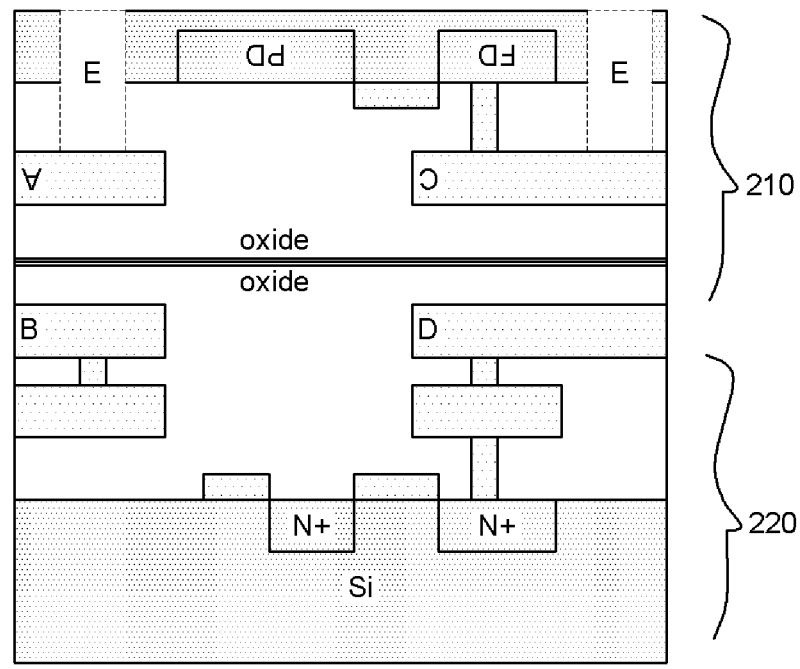
FIG. 3B illustrates that a first butting contact hole is formed from a substrate of a first wafer to a first conductive region.
Figure 3C:
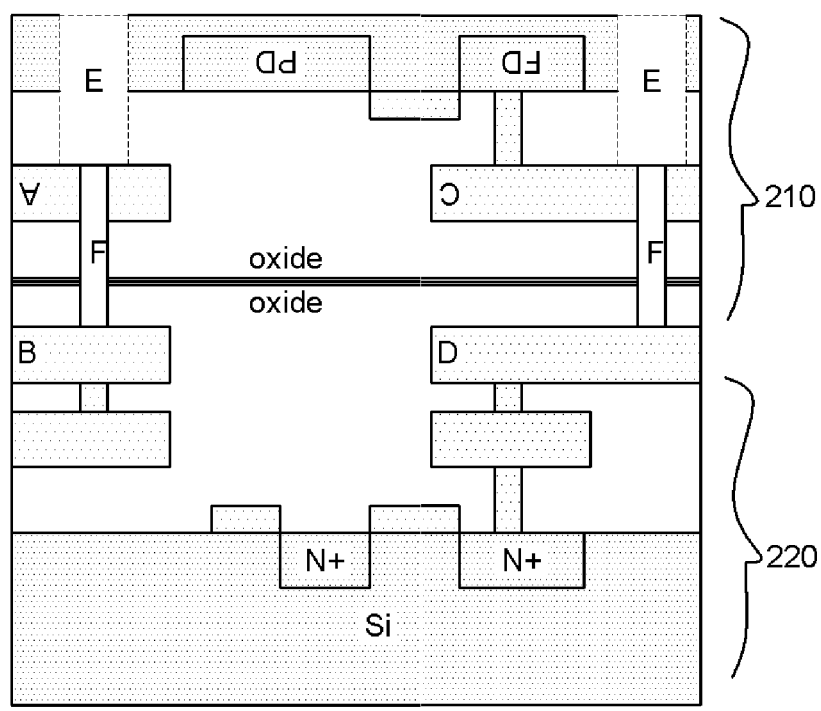
FIG. 3C illustrates that a second butting contact hole is formed from the first conductive region to a second conductive region.

FIGS. 3A to 3C are cross-sectional views illustrating a process for fabricating the semiconductor device of FIG. 2.

FIG. 3A illustrates that two wafers are physically bonded to each other.

FIG. 3B illustrates that the first butting contact hole is formed from the substrate of the first wafer to the first conductive region.

FIG. 3C illustrates that the second butting contact hole is formed from the first conductive region to the second conductive region.

Referring to FIG. 3A, when two wafers 210 and 220 are physically bonded to each other, oxides formed on the surfaces of the two wafers 210 and 220 are bonded to each other. Thus, this method is referred to as the oxide-to-oxide bonding method, and elements formed in the two wafers 210 and 220 are electrically insulated from each other.

Referring to FIG. 3B, the first butting contact hole E is formed from the substrate of the first wafer 210 to the first conductive regions A and C. During this process, a patterned mask is used to form the first butting contact hole E through a photoresist process and an etch process.

In general, a substrate of a wafer in which semiconductor elements are formed has a considerably large thickness. However, before the first butting contact hole E is formed, the bottom of the substrate of the first wafer 210 is ground to make the thickness of the substrate smaller than the substrate (Si) of the second wafer 220. Referring to FIG. 2, it can be seen that the substrate of the first wafer 210 at the bottom has a larger thickness than the substrate of the second wafer 220 at the top. The first butting contact hole E is formed through an etching process. Thus, as the thickness of the substrate to be etched is small, the etching time decreases.

The time at which the thickness of the substrate of the first wafer 210 is adjusted may be adjusted. The process may be performed before the physical bonding process of FIG. 3A or may be performed before a process of FIG. 3B and after the physical bonding process of FIG. 3A.

Referring to FIG. 3C, the second butting contact hole F is formed from the first conductive regions A and C to the second conductive regions B and D. During this process, a patterned mask is used to form the second butting hole F through a photoresist process and an etching process. When the two butting contact holes E and F are formed to have different cross-sectional areas as illustrated in FIG. 3C, the first and second butting contact holes E and F may be easily distinguished from each other.

As described above, the two butting contact holes E and F may be sequentially formed through the two processes. However, when the two butting contact holes E and F do not need to have different cross-sectional areas, one butting contact hole including two butting contact holes E and F may be formed through one etching process. In this case, since the butting contact hole is formed through one process, the process may be simplified, and the process time may be reduced.

In the present embodiment, through-silicon vias (TSVs) may be used instead of the butting contact holes. According to the TSV method, a silicon wafer is divided into a plurality of chips having a thickness of several tens of micrometers, and the same chips are vertically stacked and connected through a through-electrode. This method has an advantage in that the thickness of chips and the power consumption may be reduced, compared to a conventional wire bonding method in which stacked chips are connected through a wire.

The embodiment of the present invention may obtain the same effect even though any method is applied.

According to the embodiments of the present invention, the wafers are physically bonded to each other through the oxide-to-oxide bonding method which is simpler than the metal-to-metal bonding method, and then electrically connected to through TSVs or butting contact holes. Therefore, since the fabrication process may be simplified, a process error may be reduced, and the product yield may be improved.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A method for electrically connecting wafers, which electrically connects first and second wafers subjected to a series of processes using a butting contact structure, the method comprising:
   physically bonding the first and second wafers through an insulator-to-insulator bonding method; and
   electrically connecting a first conductive region of the first wafer to a second conductive region of the second wafer corresponding to the first conductive region through a metal-to-metal bonding method using through-silicon vias (TSVs) or butting contact holes;
   wherein the electrically-connecting of the first conductive region of the first wafer to the second conductive region of the second wafer comprises:
   forming a butting contact hole to reach the second conductive region through the substrate bottom of the first wafer and the first conductive region;
   filling a conductive material into a part of the butting contact hole corresponding to the first conductive region and a region between the first and second conductive regions; and
   filling an insulating material into the other part of the butting contact hole in which the conductive material is not filled.

2. The method of claim 1, wherein the forming of the butting contact hole comprises:
   forming a first butting contact hole to reach the first conductive region through the substrate bottom of the first wafer; and
   forming a second butting contact hole to reach the second conductive region through the first conductive region.

3. The method of claim 2, wherein the filling of the insulating material comprises filling an insulating material into the first butting contact hole, and the filling of the conductive material comprises filling a conductive material into the second butting contact hole.

4. The method of claim 3, wherein the first butting contact hole has a larger cross-sectional area than the second butting contact hole.

5. The method of claim 1, further comprising removing the substrate bottom of the first wafer to a predetermined thickness by grinding the substrate bottom of the first wafer.

6. The method of claim 5, wherein the removing of the substrate bottom of the first wafer is performed before the physically-bonding of the first and second wafers or performed before the electrically-bonding of the first conductive region of the first wafer to the second conductive region of the second wafer after the physically-bonding of the first and second wafers.

7. The method of claim 1, wherein the physically-bonding of the first and second wafers comprises physically bonding the first and second wafers through an oxide-to-oxide bonding method.

8. A semiconductor device comprising first and second wafers which are electrically connected to each other through the method of claim 1,
   wherein the first wafer comprises one or more of a plurality of elements constituting a CMOS image sensor, and
   the second wafer comprises a pixel driving circuit and the other elements of the plurality of elements constituting the CMOS image sensor excluding the elements formed in the first wafer.

9. The semiconductor device of claim 8, wherein the first wafer comprises a photodiode to generate charges corresponding to incident light among the plurality of elements constituting the CMOS image sensor.

* * * * *